(12) United States Patent
Ishizuka (10) Patent No.: US 8,741,549 B2
(45) Date of Patent: Jun. 3, 2014

(54) METHOD OF MANUFACTURING A LIQUID EJECTION HEAD AND LIQUID EJECTION HEAD

(75) Inventor: Kazunari Ishizuka, Suntou-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 101 days.

(21) Appl. No.: 13/589,779

(22) Filed: Aug. 20, 2012

(65) Prior Publication Data
US 2013/0057618 A1    Mar. 7, 2013

(30) Foreign Application Priority Data
Sep. 1, 2011    (JP) ................................. 2011-190624

(51) Int. Cl.
*B41J 2/16*    (2006.01)

(52) U.S. Cl.
USPC .......................................................... 430/320

(58) Field of Classification Search
None
See application file for complete search history.

(56) References Cited

U.S. PATENT DOCUMENTS

| | | | |
|---|---|---|---|
| 7,550,252 B2 | 6/2009 | Shimimura et al. | |
| 7,682,779 B2 | 3/2010 | Ishizuka | |
| 2003/0169313 A1* | 9/2003 | Shimomura et al. | 347/45 |
| 2006/0277755 A1* | 12/2006 | Kubota et al. | 29/890.1 |
| 2008/0113277 A1* | 5/2008 | Cominetti et al. | 430/5 |
| 2010/0255422 A1 | 10/2010 | Ishizuka et al. | |
| 2010/0255424 A1 | 10/2010 | Shiba et al. | |

FOREIGN PATENT DOCUMENTS

| | | |
|---|---|---|
| JP | 5-127369 A | 5/1993 |
| JP | 6-45242 A | 2/1994 |

\* cited by examiner

*Primary Examiner* — John A. McPherson
(74) *Attorney, Agent, or Firm* — Fitzpatrick, Cella, Harper & Scinto (57) ABSTRACT

Provided is a method of manufacturing a liquid ejection head, including: forming a covering resin layer including a photo-cationic polymerization initiator and a cationically polymerizable resin on a substrate having provided thereon an energy generating element for generating energy for ejecting liquid and a solid layer which is formed of a positive resist and serves as a pattern for a liquid flow path which communicates with a liquid ejection orifice for ejecting the liquid; exposing the covering resin layer to development to form the liquid ejection orifice; and removing the solid layer to form the liquid flow path, in which the covering resin layer includes, as a cationic polymerization inhibitor, an amine compound having a perfluoroalkyl group. Also provided is a liquid ejection head obtained by the method.

5 Claims, 4 Drawing Sheets

METHOD OF MANUFACTURING A LIQUID EJECTION HEAD AND LIQUID EJECTION HEAD

BACKGROUND OF THE INVENTION

1. Field of the Invention

The present invention relates to a method of manufacturing a liquid ejection head such as an ink jet recording head, and a liquid ejection head formed by the method.

2. Description of the Related Art

Japanese Patent Publication No. H06-45242 describes a method of producing an ink jet recording head which is one of liquid ejection heads. First, an ink flow path pattern is formed with a soluble resin on a substrate having formed thereon energy generating elements. Next, a covering resin layer including a cationically polymerizable resin and a photocationic polymerization initiator is formed on the ink flow path pattern, and ink ejection orifices are formed above the energy generating elements by photolithography. Finally, the soluble resin is dissolved and the covering resin layer is then cured to form an ink flow path member.

On the other hand, as described in Japanese Patent Application Laid-Open No. H05-127369, it has been known that a material which functions as a base such as an amine is added to an acid generated from a photocationic polymerization initiator so as to obtain a patterned shape having good dimensional controllability with a chemical amplification type resist. This material renders an acid concentration distribution in a mask edge steep to enhance the dimensional controllability.

In order to realize high-quality printing and obtain a stable printing effect constantly in an ink jet printer, it is desired that ink meniscus be constantly formed at a given position in an ink ejection orifice.

Figure 1A:
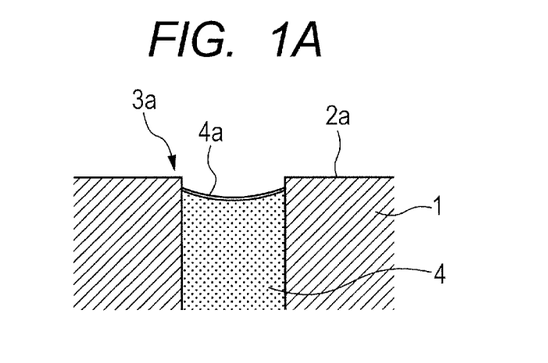
FIGS. 1A, 1B and 1C are schematic cross-sectional views of an ink ejection orifice, for illustrating a relationship between an ink meniscus and the shape of an edge of the ink ejection orifice.
Figure 1B:
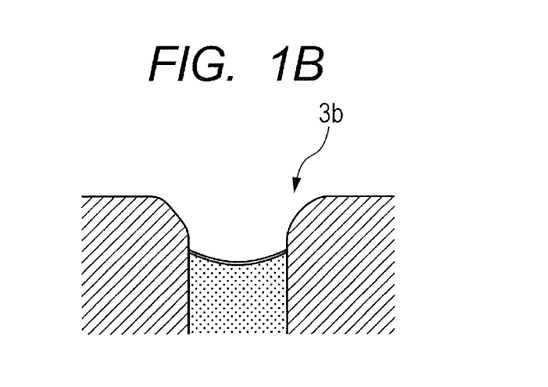
Figure 1C:
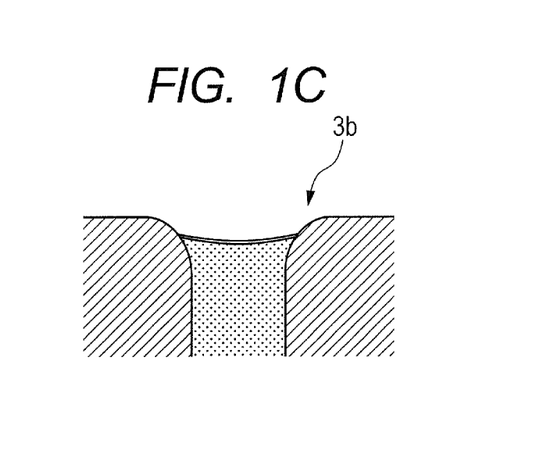

Herein, FIGS. 1A to 1C are cross-sectional views of an ink ejection orifice, illustrating meniscus 4a of ink 4. In the case where an ink ejection orifice edge is sharp as indicated by reference numeral 3a in FIG. 1A, the meniscus 4a of the ink 4 can be constantly formed at a given position. On the other hand, in the case where the ink ejection orifice edge is round as indicated by 3b in FIGS. 1B and 1C, meniscus of ink may not be formed at a given position in the ink ejection orifice.

In the case of forming an ink ejection orifice by photolithography, in order to cure an ink flow path member 1 up to a bottom portion thereof, the exposure amount of a surface of the ink flow path member 1 (ink ejection orifice surface 2a) on which an ejection orifice is to be formed is larger than that of the bottom portion. Specifically, the amount of an acid generated from a photocationic polymerization initiator on the ink ejection orifice surface 2a is larger than that of the bottom portion of the ink flow path member 1, and a curing reaction proceeds rapidly in the vicinity of the ink ejection orifice surface 2a. Consequently, the edge shape of the ink ejection orifice may become round. That state tends to become more conspicuous as the thickness of the ink flow path member 1 increases.

Here, the edge shape of the ink ejection orifice can be prevented from becoming round by adding a basic material such as amine to the ink flow path member as described above to deactivate an acid generated in the vicinity of the ink ejection orifice surface. However, this effect applies to only the case where the thickness of the ink flow path member is small. The basic material is present uniformly in the ink flow path member, and hence, in the case where the thickness of the ink flow path member increases, the exposure amount of the ink ejection orifice surface for curing the ink flow path member up to the bottom portion thereof increases further. Therefore, the acid generated in the vicinity of the ink ejection orifice surface is present in a large amount without being deactivated completely with a basic material, with the result that the curing reaction proceeds rapidly in the vicinity of the ink ejection orifice surface, and the edge shape of the ink ejection orifice ends up becoming round.

In view of the foregoing, it is an object of the present invention to provide a liquid ejection head, the edge shape of a liquid ejection orifice of which is sharp even in the case where the thickness of a liquid flow path member increases, and which enables high-quality printing, and a method of manufacturing the liquid ejection head.

SUMMARY OF THE INVENTION

A method of manufacturing a liquid ejection head according to the present invention includes: forming a covering resin layer including a photocationic polymerization initiator and a cationically polymerizable resin on a substrate having provided thereon an energy generating element for generating energy for ejecting liquid and a solid layer which is formed of a positive resist and serves as a pattern for a liquid flow path which communicates with a liquid ejection orifice for ejecting the liquid; exposing the covering resin layer to development to form the liquid ejection orifice; and removing the solid layer to form the liquid flow path, in which the covering resin layer includes, as a cationic polymerization inhibitor, an amine compound having a perfluoroalkyl group.

Further, a liquid ejection head of the present invention includes: a substrate having an energy generating element for generating energy for ejecting liquid; and a liquid flow path member including a liquid ejection orifice for ejecting the liquid and a liquid flow path which communicates with the liquid ejection orifice, in which the liquid flow path member further includes an amine compound having a perfluoroalkyl group is present in the liquid flow path member with a concentration gradient in a thickness direction of the liquid flow path member, and a concentration of the amine compound is highest in an outermost layer of the liquid flow path member.

Further features of the present invention will become apparent from the following description of exemplary embodiments with reference to the attached drawings.

DESCRIPTION OF THE EMBODIMENTS

The present inventor has made intensive studies in order to solve the above-mentioned problems. As a result, the inventor has found that the problems can be solved by selecting an amine compound having a perfluoroalkyl group as a cationic polymerization inhibitor to be added to a covering resin layer. A liquid ejection head obtained by the present invention can be used as an ink jet recording head for performing recording by ejecting ink onto a recording medium and a liquid ejection head for producing a biochip or printing an electronic circuit.

Liquid Ejection Head

Hereinafter, the liquid ejection head obtained by the present invention is described specifically with reference to the attached drawings. The liquid ejection head is described with a focus on an ink jet recording head focused on. In the following description, components having the same functions are denoted with the same reference symbols in the drawings, and the descriptions thereof may be omitted.

Figure 2:
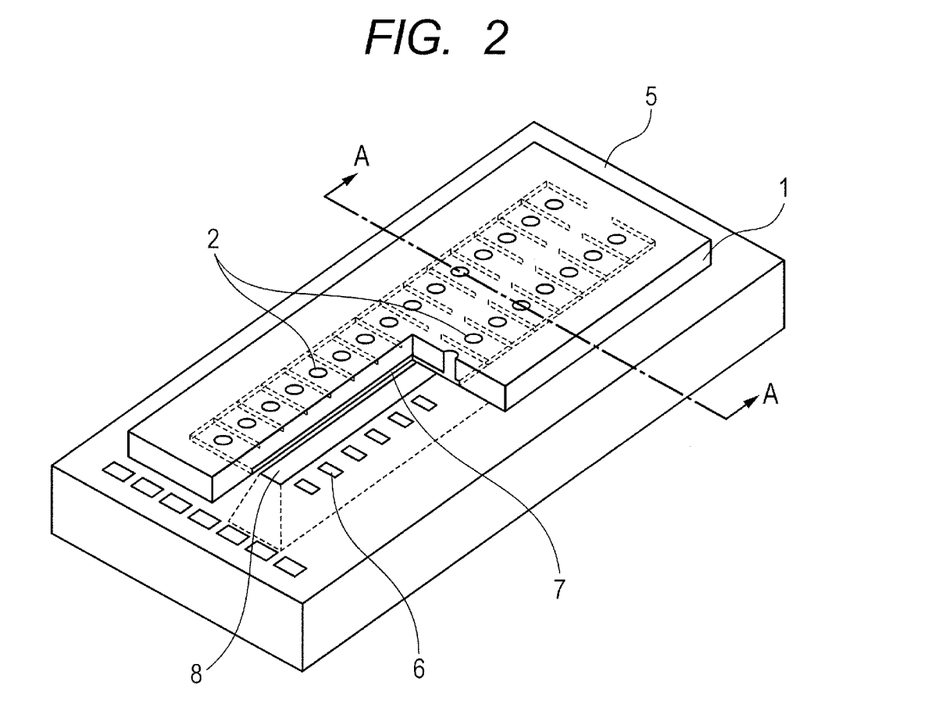
FIG. 2 is a schematic view of an ink jet recording head obtained by a manufacturing method of the present invention.

FIG. 2 illustrates an example of an ink jet recording head.

The ink jet recording head illustrated in FIG. 2 includes an ink flow path member (liquid flow path member) and a substrate 5. The substrate 5 includes energy generating elements 6 for generating energy for ejecting a liquid, specifically, ink. The ink flow path member 1 includes ink ejection orifices (liquid ejection orifices) 2 for ejecting ink and an ink flow path (liquid flow path) 7 which communicates with the ink ejection orifices 2 and holds ink. In FIG. 2, the multiple energy generating elements 6 are aligned in two rows in a longitudinal direction of the substrate 5 at a predetermined pitch. Further, control signal input electrodes for operating the energy generating elements 6 can be connected to the energy generating elements 6. Further, the substrate 5 includes an ink supply port (liquid supply port) 8 for supplying ink to the ink flow path 7. The ink ejection orifices 2 can be formed above the energy generating elements 6, and in FIG. 3G described later, the ink ejection orifices are formed in an upper part of the drawing of the energy generating elements.

Method of Manufacturing Liquid Ejection Head

A manufacturing method of the present invention includes the following steps of:

(1) forming a covering resin layer including a photocationic polymerization initiator and a cationically polymerizable resin on a substrate having provided thereon the energy generating elements and a solid layer which is formed of a positive resist and serves as a pattern for the ink flow path;
(2) exposing the covering resin layer to development to form ink ejection orifices; and
(3) removing the solid layer to form an ink flow path.

A step 4 of heat-treating the covering resin layer while exposing a surface of the covering resin layer on which the ink ejection orifices are to be formed may be inserted between the steps 1 and 2, and a step 5 of forming an ink supply port on the substrate may be inserted between the steps 2 and 3. Further, in the present invention, the covering resin layer contains, as a cationic polymerization inhibitor, an amine compound having a perfluoroalkyl group.

Figure 3A:
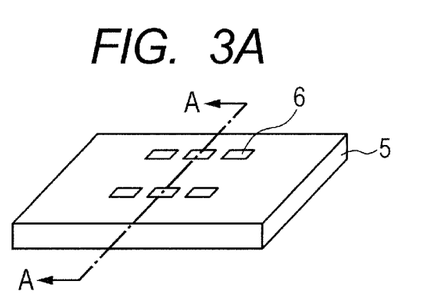
FIGS. 3A, 3B, 3C, 3D, 3E, 3F and 3G are views illustrating the respective steps of the manufacturing method of the present invention.

Hereinafter, an example of an embodiment of the present invention is described in detail with reference to FIGS. 3A to 3G. The present invention is not limited thereto. FIG. 3A illustrates the substrate 5 having the energy generating elements 6, and FIGS. 3B to 3G are schematic cross-sectional views of the respective steps, taken along the line A-A of FIGS. 2 and 3A.

Step 1

Figure 3B:
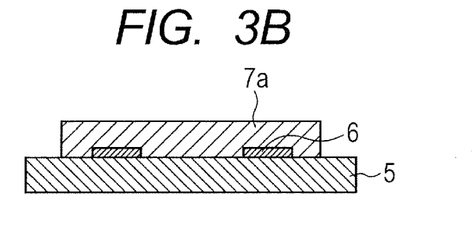

First, as illustrated in FIG. 3B, a positive photosensitive resin layer is formed on the substrate 5 on which the energy generating elements 6 are formed, and the resin layer is patterned to form a solid layer 7a to serve as a pattern for an ink flow path (ink flow path pattern) (step 1-1).

As the substrate 5, for example, a Si wafer having a crystal axis (100) can be used, and as the energy generating elements, for example, electrothermal transducers or piezoelectric elements can be used. The solid layer may be formed directly on a surface of the substrate 5, or alternatively, any other layer (for example, an adhesion layer or a flattening layer) may be provided between the substrate 5 and the solid layer.

As a material for the solid layer 7a, that is, a material for the positive photosensitive resin layer, a positive photosensitive resin known in the field of liquid ejection heads can be appropriately selected and used. Although there is no particular limitation to the resin, a material having a low absorbance with respect to light (generally, ultraviolet light) used for exposure in the step 2 is preferred. This can easily prevent the solid layer 7a from being exposed to light to cause patterning defects during exposure in the step 2. An example of the positive photosensitive resin is polymethyl isopropenyl ketone (PMIPK), which can be exposed to Deep UV light.

The positive photosensitive resin layer can be formed, for example, by dissolving a positive photosensitive resin in a solvent appropriately, applying on the substrate 5 the obtained solution by spin coating, and pre-baking the coated solution. For example, in the case of using PMIPK as the resin, cyclohexanone can be used as the solvent.

Further, the solid layer 7a formed of a positive photosensitive resin layer is a positive resist, and the solid layer 7a can be removed from the substrate 5 by exposure and development in the step 3. For example, in the case of using PMIPK as the positive photosensitive resin, the solid layer 7a can be dissolved and removed with a solvent (such as methyl acetate or methyl lactate).

A method of patterning the positive photosensitive resin layer is, for example, the following method. First, the positive photosensitive resin layer is irradiated via a mask with an active energy ray capable of photosensitizing the positive photosensitive resin to perform pattern exposure. After that, the resin layer may be developed with, for example, a solvent capable of dissolving the exposed portion of the resin layer and subjected to rinsing treatment to form the solid layer 7a.

Although the thickness of the solid layer 7a (thickness from the surface of the substrate 5 in FIG. 3B) can be selected depending on an intended height of an ink flow path and is not particularly limited, the thickness can be set to be 5 µm or more and 20 µm or less, for example.

Figure 3C:
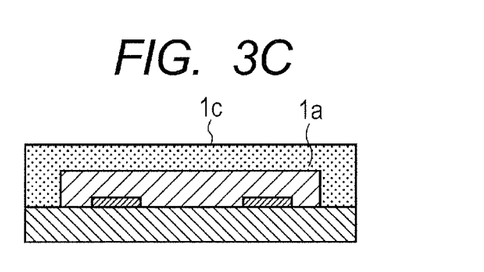

Next, as illustrated in FIG. 3C, the covering resin layer 1a including a cationically polymerizable resin, a photocationic polymerization initiator, and a cationic polymerization inhibitor is formed on the solid layer 7a and the substrate 5 (step 1-2). At this time, the covering resin layer 1a can be formed so as to cover (coat) each of the surfaces of the solid layer 7a and the substrate 5. Further, the covering resin layer 1a may be formed directly on the solid layer 7a, or any other layer (for example, a compatibility prevention layer or a scum prevention layer) may be provided between the covering resin layer 1a and the solid layer 7a.

As the cationically polymerizable resin, any cationically polymerizable resin such as an epoxy-based resin, an oxetane-based resin, or a vinyl ether-based resin can be used. Of those, an epoxy-based resin or an oxetane-based resin such as an alicylic epoxy resin or a glycidyl ether resin is preferably used in consideration of small volume shrinkage during curing and physical properties of a cured product.

Further, as the photocationic polymerization initiator, a wide range of photocationic polymerization initiators including onium salts such as ionic sulfonium salts and iodonium salts which are generally known can be used. However, an onium salt containing phosphorus-based $PF_6$ or antimony-based $SbF_6$ as an anion is preferred from a viewpoint of a high cationic polymerization activity.

The cationic polymerization inhibitor can be appropriately selected and used from compounds each having a perfluoroalkyl group and amine (primary to tertiary amines) in a molecular structure. Examples of the compounds include amine compounds each represented by the following formula 1. In the formula 1, n represents a positive integer. Of those compounds, an amine compound represented by the formula 1 in which n represents an integer of 3 or more is preferably used, and an amine compound represented by the formula 1 in which n represents an integer of 7 or more is more preferably used. The reason for this is described later.

$$CF_3(CF_2)_nCH_2NH_2 \quad \text{Formula 1}$$

The covering resin layer 1a can be formed, for example, by applying on the solid layer 7a and the substrate 5, a solution in which a material for the covering resin layer 1a (material for forming a covering resin layer) is dissolved in a solvent appropriately and evaporating the solvent. In the case of using a solvent, the solvent can be appropriately selected and used from solvents which do not dissolve the solid layer 7a, and it is preferred to use xylene from a viewpoint of process suitability such as application property. The concentration of the material for forming a covering resin layer in the solution can be adjusted appropriately.

A coating method and an evaporation method of the solution can be appropriately selected and used from methods known in the field of liquid ejection heads. In the case of using, for example, spin coating as the application method of the solution, most part of the solvent is generally evaporated during coating, and hence, an evaporation operation does not need to be performed separately. In the case of performing the following step 4, a heat treatment operation in the step 4 also functions as the evaporation operation of the solvent, and hence, a removal operation can be omitted.

The covering resin layer and the material for forming a covering resin layer can include not only a cationically polymerizable resin such as an epoxy resin, a photocationic polymerization initiator, and a cationic polymerization inhibitor but also materials for providing other functions. Examples of the materials for providing the other functions include a material for enhancing adherence such as polyether amide and a swelling suppressing material.

Further, the content of the cationically polymerizable resin in a coating solution for the covering resin layer is preferably 40% by mass or more in terms of coating property and 80% by mass or less in terms of stability against precipitation and the like. It is preferred that the content of the photocationic polymerization initiator in the coating rein layer (solid content) be 1 part by mass or more in terms of curing property and 10 parts by mass or less in terms of patterning property, with respect to 100 parts by mass of the cationically polymerizable resin. It is preferred that the content of the cationic polymerization inhibitor (amine compound having a perfluoroalkyl group) in the covering resin layer (solid content) be 0.5 part by mass or more in terms of the effect of inhibiting polymerization and 5 parts by mass or less in terms of curing property, with respect to 100 parts by mass of the photocationic polymerization initiator. It is preferred that the content of the cationically polymerizable resin in the covering resin layer after the coating solution is applied and the solvent is evaporated be 80% by mass or more and 99% by mass or less.

Step 4

Figure 3D:
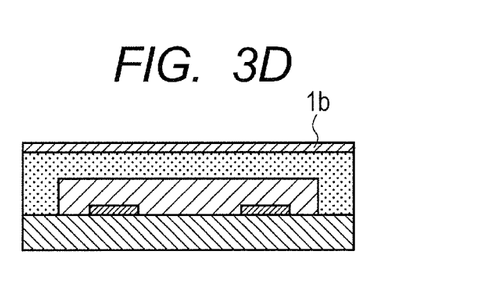

Next, as illustrated in FIG. 3D, the step 4 of heat-treating the coating rein layer 1a while exposing a surface of the covering resin layer 1a (ink ejection orifice surface) 1c on which ink ejection orifices are to be formed can be inserted between the steps 1 and 2. Because of the step 4, a solvent remaining in the covering resin layer 1a can be removed easily, and simultaneously with this, an amine compound having a perfluoroalkyl group can be easily segregated in the thickness direction of the covering resin layer 1a. More specifically, the amine compound is allowed to be present in a relatively large amount (localized) in the vicinity of the surface of the covering resin layer 1a, and thereby, an ink ejection orifice edge can be easily prevented from becoming round. In FIG. 3D, the amine compound is localized in a surface portion 1b.

Incidentally, the state in which the ink ejection orifice surface 1c of the covering resin layer 1a is exposed refers to the case where other layers or members are not formed on the ink ejection orifice surface 1c (upper portion of the drawing of the ejection orifice surface 1c in FIG. 3C) of the covering resin layer 1a. In other words, when the step 4 is conducted, the covering resin layer 1a can be an outermost layer of the layers provided on the substrate 5.

The heat treatment can be conducted in air. A specific heating temperature is preferably 40° C. or more from a viewpoint of segregating an amine compound efficiently and 100° C. or lower from a viewpoint of patterning of the covering resin layer 1a. Further, an example of the heating method is heating with a hot plate. In the case where the heat treatment of the step 4 is conducted in air, the ink ejection orifice surface 1c can be an interface between the air and the covering resin layer 1a.

Figure 4:
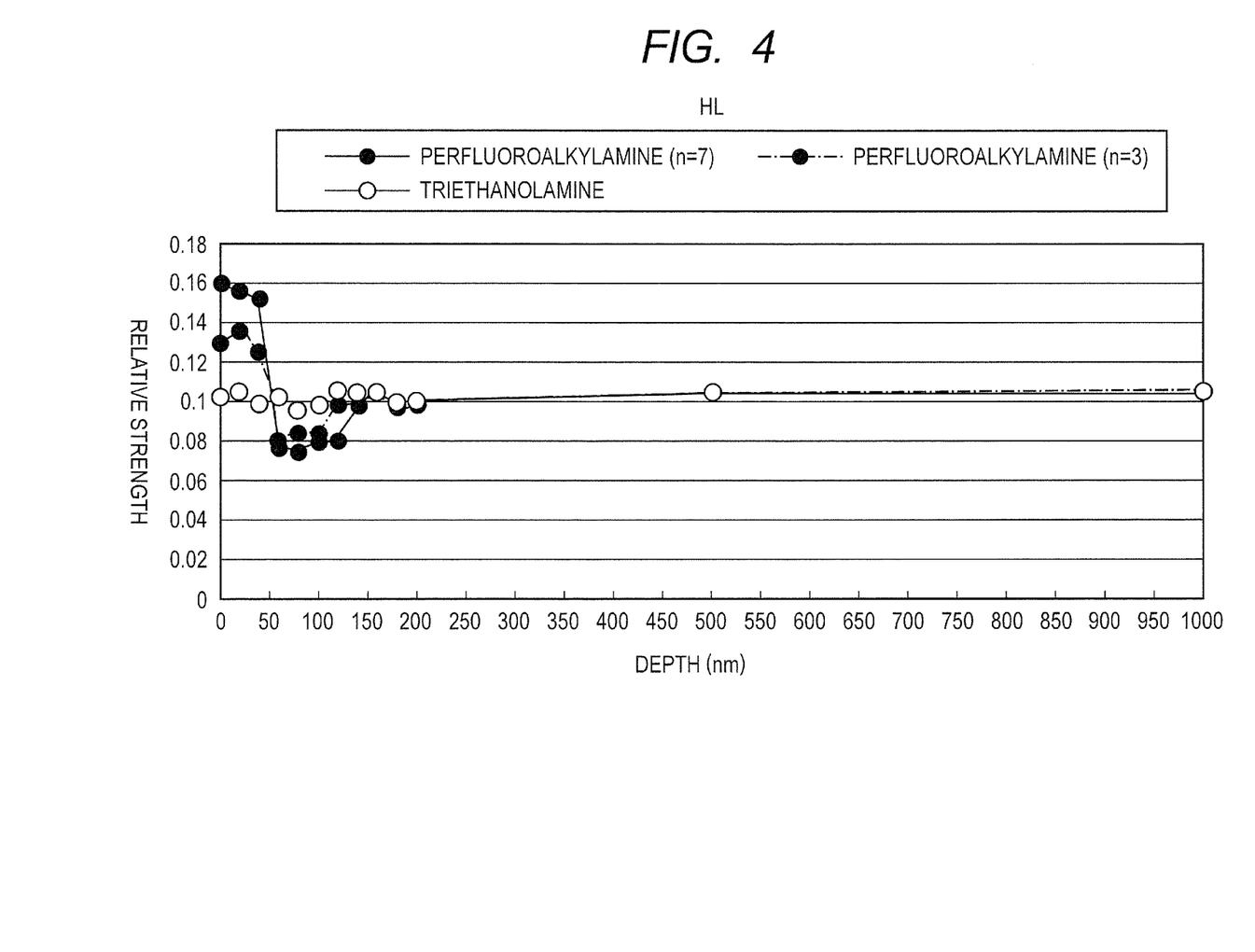
FIG. 4 is a graph showing amine relative strength in a thickness direction of a covering resin layer.

FIG. 4 shows the kinds of cationic polymerization inhibitors (amine compounds) each included in the covering resin layer and the amine relative strength in a depth (thickness) direction of the covering resin layer for each kind. As the photocationic polymerization initiator included in the covering resin layer, a compound represented by the formula 5 in examples (described later) is used in each case, and as the cationically polymerizable resin, a compound represented by the formula 4 in the examples (described later) is used in each case. The graph of FIG. 4 is obtained by cutting a covering resin layer (thickness: 5 μm) diagonally to form a cross-section, measuring a CHN amount and a CH amount by Tof-SIMS (time-of-flight secondary ion mass spectrometry), and profiling, as amine relative strength, a strength of the CHN amount with respect to the CH amount in the depth direction of the covering resin layer, based on the shape of the cross-section measured with a surface profiler gauge. The depth in FIG. 4 refers to a depth from the surface of the covering resin layer (ink ejection orifice surface 1c), and the depth of 0 nm indicates the surface of the covering resin layer.

It can be seen from FIG. 4 that triethanolamine having no perfluoroalkyl group is present substantially uniformly in the covering resin layer. In contrast, it can be seen that perfluoroalkylamines represented by the following formulae 2 and 3, respectively, are localized in the vicinity of the surface.

$$CF_3CF_2CF_2CF_2CF_2CF_2CF_2CF_2CH_2NH_2 \quad \text{Formula 2}$$

$$CF_3CF_2CF_2CF_2CH_2NH_2 \quad \text{Formula 3}$$

In FIG. 4, as a result of observing the amine relative strength in the vicinity of the surface of the covering resin layer in more detail, the following was found. It can be seen that, in the perfluoroalkylamines represented by the formulae 2 and 3, respectively, the relative strength in the vicinity of the surface, specifically, a portion from the surface to a depth of about 40 nm (surface portion 1b) is relatively high, and the relative strength at a depth of about 40 to 100 nm is relatively low. Thus, an amine compound present at a depth of about 40 to 100 nm is considered to have been precipitated in the vicinity of the surface. This represents a feature of a perfluoroalkyl group. When —$CF_3$ groups each having a remarkably low critical surface tension are present in a matrix resin, a driving force acts so as to minimize free energy at the air interface, and the —CF$_3$ groups are localized easily on the air interface side. This phenomenon is seen particularly when a resin is heat-treated with an amine compound represented by the formula 1 in which n represents an integer of 3 or more. Further, it is known that, as n in the formula 1 increases, crystallinity is improved, and when n represents an integer of 7 or more, the amine compound is packed most densely. When the crystallinity is improved, the amine compound is present uniformly on the surface of the covering resin layer, and hence, the shape of the ink ejection orifices on the surface of the covering resin layer can easily be made stable. Accordingly, n in the formula 1 represents preferably an integer of 3 or more, more preferably an integer of 7 or more. From a viewpoint of stability against precipitation and the like, n in the formula 1 preferably represents an integer of 10 or less.

According to the manufacturing method of the present invention, the following inkjet recording head can be obtained. Specifically, an ink recording head can be obtained in which an amine compound having a perfluoroalkyl group is present in an ink flow path member (liquid flow path member) with a concentration gradient in the thickness direction of the ink flow path member, and the concentration of the amine compound is highest in the outermost layer (corresponding to the surface portion 1b in FIG. 3D) of the ink flow path member.

The outermost layer of the ink flow path member can be, for example, a portion from the surface of the ink flow path member to a depth of 50 nm in the thickness direction of the ink flow path member. Further, the concentration gradient of the amine compound in the thickness direction of the ink flow path member can be checked, for example, by measuring the amine relative strength from the surface of the ink flow path member to a depth of 150 nm with, for example, Tof-SIMS.

As the thickness of the covering resin layer 1a, it is preferred that the thickness thereof on the solid layer 7a, i.e., the thickness thereof from the surface of the solid layer 7a be 3 µm or more from a viewpoint of the strength of the resin layer. Further, the upper limit of the thickness can be appropriately selected depending on the developing property of the ink ejection orifice portions, and is not particularly limited. However, it is preferred that the thickness of the covering resin layer 1a on the solid layer 7a be 70 µm or less from a viewpoint of the ejection performance of ink.

Step 2

Figure 3E:
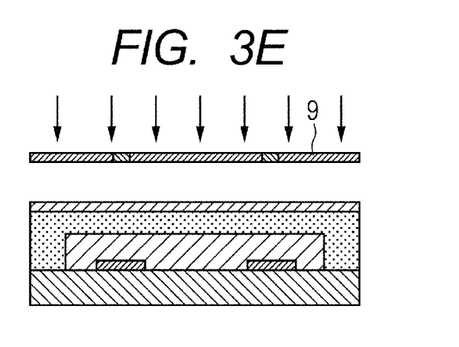
Figure 3F:
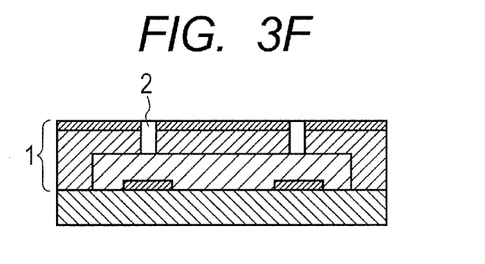

Next, as illustrated in FIG. 3E, the covering resin layer 1a is exposed to (irradiated with), for example, an active energy ray (i-line or the like) including ultraviolet light via a mask 9 from above the covering resin layer 1a (from an upper portion of the drawing of FIG. 3E) to form latent images to be ink ejection orifices 2 corresponding to unexposed portions (not shown), and the exposed portions of the covering resin layer 1a are cured. Then, by developing the covering resin layer 1a with, for example, a solvent, the ink flow path member 1 having the ink ejection orifices 2 is formed as illustrated in FIG. 3F. At this time, the covering resin layer 1a exposed to light can also be cured further by heating before the development and can be subjected to rinsing treatment after the development. In FIG. 3F, an ink flow path is occupied by (filled with) the solid layer 7a. The opening shape of the ink ejection orifices 2 can be appropriately determined depending on the size of ink droplets to be ejected.

Step 5

Next, a step of forming the ink supply port 8, for example, by anisotropic etching such as dry etching or wet etching may be inserted between the steps 2 and 3. As an etchant for a silicon substrate, for example, tetramethylammonium hydroxide (TMAH) can be used.

Step 3

Figure 3G:
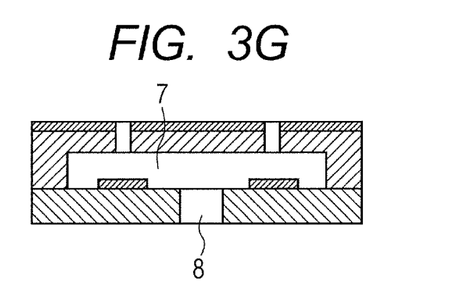

Subsequently, as illustrated in FIG. 3G, the solid layer 7a is removed to form the ink flow path 7.

A method of removing the solid layer 7a is, for example, a method of soaking the substrate in a solvent capable of dissolving the solid layer 7a, and dissolving and removing the solid layer 7a through the ink supply port 8 and the ink ejection orifices 2. Further, as needed, the solid layer 7a may be exposed to an active energy ray capable of photosensitizing the solid layer 7a to enhance the solubility of the solid layer 7a.

Further, the substrate obtained in the step 3 can be electrically connected so as to drive the energy generating elements 4, and an ink supply member or the like for supplying ink can also be connected to the substrate.

The ink jet recording head according to the present invention is mountable to apparatus such as a printer, a copier, a facsimile having a communication system, and a word processor having a printer unit, and industrial recording apparatus integrally combined with various processing apparatus. Further, the use of the ink jet recording head according to the present invention allows recording in a variety of recording media made of paper, yarn, fiber, leather, metal, plastic, glass, wood, ceramic, and the like.

EXAMPLES

Production of Ink Jet Recording Head
Hereinafter, the present invention is further specifically described by way of examples. However, the present invention is not limited to these examples.
Evaluation Method
Observation of Ejection Orifice Edge
The cross-section of an ink ejection orifice edge of an ink jet recording head produced in each example was observed with a scanning electron microscope (SEM), and the shape of the cross-section was evaluated based on the following criteria.
Evaluation Criteria for Ejection Orifice Edge Shape
☐: very sharp  ○: sharp  Δ: relatively round
Evaluation of Ink Ejection
The ink jet recording head produced in each example was mounted to an ink jet printer (trade name: "MP560" manufactured by Canon Inc.). The ejection of ink was evaluated through use of ink having the following composition, and the landing accuracy was measured. Then, the results were evaluated based on the following criteria. The landing accuracy refers to a displacement of an ink droplet landed on paper (distance from an intended landing position to the center of the ink droplet).
Ink Composition
Pure water/diethylene glycol/isopropyl alcohol/lithium acetate/black dye Food Black 2=79.4/15/3/0.1/2.5 (mass ratio)
Evaluation Criteria for Ink Ejection
☐: Very satisfactory with a landing accuracy of 2 µm or less
○: Satisfactory with a landing accuracy of more than 2 µm and 3 µm or less
Δ: Within an allowable range with a landing accuracy of more than 3 µm and 5 µm or less Example 1

First, as illustrated in FIG. 3A, polymethyl isopropenyl ketone (trade name: "ODUR-1010" manufactured by TOKYO OHKA KOGYO CO., LTD.) as a positive photosensitive resin was applied onto a silicon substrate 5 having formed thereon electrothermal transducing elements 6 as energy generating elements by spin coating. Next, the silicon substrate was subjected to prebaking at 120° C. for 6 minutes. Then, pattern exposure of an ink flow path (exposure amount:

14 J/cm²) was carried out with a Deep UV exposing machine (trade name: "UX-3000" manufactured by Ushio Inc.). After that, the resultant was developed with methyl isobutyl ketone and subjected to rinsing treatment with isopropyl alcohol (IPA). Thus, a solid layer 7a was formed (step 1-1, FIG. 3B). Incidentally, the solid layer 7a had a thickness from the surface of the substrate of 20 µm.

Next, the following resin composition 1 was dissolved at a concentration of 50 mass % in xylene. The solution was applied onto the solid layer 7a and the silicon substrate 5 by spin coating, thereby forming a covering resin layer 1a (step 1-2, FIG. 3C). Incidentally, the thickness of the covering resin layer 1a from the surface of the solid layer (thickness of the covering resin layer on the ink flow path pattern) was 20 µm.

| Resin composition 1 | |
|---|---|
| Cationically polymerizable resin Compound represented by the following formula 4 (trade name: "EHPE-3150" manufactured by Daicel Chemical Industries Limited) | 100 parts by mass |

Formula (4)

In the formula 4, l, m, and n each represent a positive integer.

| Photocationic polymerization initiator | |
|---|---|
| Compound represented by the following formula 5 | 1.5 parts by mass |

Formula (5)

[Chemical structure showing triphenylsulfonium compound with SbF₆⁻ counterion]

| Cationic polymerization inhibitor Compound represented by the following formula 2 | 0.015 part by mass |
|---|---|

Subsequently, heat treatment was conducted at 90° C. for 3 minutes to remove a solvent remaining in the covering resin layer 1a, and simultaneously with this, an amine compound represented by the formula 2 was localized in a surface portion 1b of the covering resin layer 1a (step 4, FIG. 3D).

Then, the covering resin layer was exposed (exposure amount: 5,500 J/m²) from the ink ejection orifice surface side via a mask 9 through use of an i-line stepper exposing machine (trade name: "i5" manufactured by Canon Inc.) (FIG. 3E).

Then, the layers were subjected to post-exposure baking (PEB) at 90° C. for 4 minutes, development with methyl isobutyl ketone, and rinsing treatment with IPA. Thus, the covering resin layer was further cured to obtain an ink flow path member 1 and to form ink ejection orifices 2 (step 2, FIG. 3F). The opening shape of each of the ink ejection orifices was a circular shape, and the diameter thereof was 30 µm.

Next, the resultant was subjected to etching in TMAH to form an ink supply port 8 (step 5). Then, the resultant was exposed (exposure amount: 27 J/cm²) again with the Deep UV exposing apparatus (trade name: "UX-3000" manufactured by Ushio Inc.). After that, the resultant was immersed in methyl lactate while applying ultrasonic waves to dissolve and remove the remaining solid layer 7a. Thus, an ink flow path 7 was formed (step 3, FIG. 3G).

Finally, an ink supply member formed of alumina was adhered to the back surface of the silicon substrate 5 having formed therein the ink supply port 8. Thus, an ink jet recording head was completed.

The ejection orifice edge shape of the ink jet recording head and the landing accuracy of ink ejection were evaluated according to the above-mentioned evaluation method. Table 1 shows the evaluation results.

Example 2

An ink jet recording head was produced and evaluated in the same manner as in Example 1 with the exception that the following resin composition 2 was used as a material for the covering resin layer 1a. Table 1 shows the evaluation results.

| (Resin composition 2) | |
|---|---|
| Cationically polymerizable resin Compound represented by the formula 4 | 100 parts by mass |
| Photocationic polymerization initiator Compound represented by the formula 5 | 1.5 parts by mass |
| Cationic polymerization inhibitor Compound represented by the following formula 3 | 0.015 part by mass |

Example 3

An ink jet recording head was produced and evaluated in the same manner as in Example 1 with the exception that the thickness of the covering resin layer 1a from the surface of the solid layer 7a was set to be 40 µm and the exposure amount in the step 2 was set to be 8,000 J/m². Table 1 shows the evaluation results.

Example 4

An ink jet recording head was produced and evaluated in the same manner as in Example 2 with the exception that the thickness of the covering resin layer 1a from the surface of the solid layer 7a was set to be 40 μm and the exposure amount in the step 2 was set to be 8,000 J/m². Table 1 shows the evaluation results.

Comparative Example 1

An ink jet recording head was produced and evaluated in the same manner as in Example 1 with the exception that the following resin composition 3 was used as a material for the covering resin layer 1a. Table 1 shows the evaluation results.

| (Resin composition 3) | |
|---|---|
| Cationically polymerizable resin Compound represented by the formula 4 | 100 parts by mass |
| Photocationic polymerization initiator Compound represented by the formula 5 | 1.5 parts by mass |
| Cationic polymerization inhibitor Triethanolamine having a structure represented by the following formula 6 | 0.015 part by mass |

Comparative Example 2

An ink jet recording head was produced and evaluated in the same manner as in Example 1 with the exception that the following resin composition 4 was used as a material for the covering resin layer 1a and the exposure amount in the step 2 was set to be 4,500 J/m². Table 1 shows the evaluation results.

| (Resin composition 4) | |
|---|---|
| Cationically polymerizable resin Compound having a structure represented by the formula 4 | 100 parts by mass |
| Photocationic polymerization initiator Compound having a structure represented by the formula 5 | 1.5 parts by mass | hand, such tendency was not obtained in Comparative Examples 1 and 2.

Further, as shown in Table 1, in the case where the thickness of the ink flow path member on the ink flow path pattern is 20 μm, in each of the ink jet recording head using triethanolamine as the cationic polymerization inhibitor (Comparative Example 1) and the ink jet recording head with a conventional configuration which does not use a cationic polymerization inhibitor (Comparative Example 2), there is a tendency that the ink ejection orifice shape is round and printing quality is degraded. In contrast, in the case of using a perfluoroalkylamine compound as the cationic polymerization inhibitor according to the present invention, the ink ejection orifice shape is sharp and printing quality is also satisfactory (Examples 1 and 2). Further, even in the case where the thickness of the ink flow path member on the ink flow path pattern is as large as 40 μm, when a perfluoroalkylamine compound is used as the cationic polymerization inhibitor, the ink ejection orifice shape is sharp and printing quality is also satisfactory (Examples 3 and 4).

It has been confirmed from Examples 1 to 4 that, according to the method of the present invention, an ink jet recording head, the edge shape of an ink ejection orifice of which is sharp even in the case where the thickness of an ink flow path member increases, and which enables high-quality printing, can be produced.

According to the present invention, a liquid ejection head, the edge shape of a liquid ejection orifice of which is sharp even in the case where the thickness of a liquid flow path member increases, and which enables high-quality printing, and a method of manufacturing the liquid ejection head can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

TABLE 1

| | Cationic polymerization inhibitor | Thickness of ink flow path member on ink flow path pattern | Evaluation of ejection orifice edge shape | Evaluation of ink ejection |
|---|---|---|---|---|
| Example 1 | $CF_3CF_2CF_2CF_2CF_2CF_2CF_2CF_2CH_2NH_2$ | 20 μm | ☐ | ☐ |
| Example 2 | $CF_3CF_2CF_2CF_2CH_2NH_2$ | 20 μm | ○ | ○ |
| Example 3 | $CF_3CF_2CF_2CF_2CF_2CF_2CF_2CH_2NH_2$ | 40 μm | ○ | ○ |
| Example 4 | $CF_3CF_2CF_2CF_2CH_2NH_2$ | 40 μm | ○ | ○ |
| Comparative Example 1 | $N(CH_2CH_2OH)_3$ | 20 μm | Δ | Δ |
| Comparative Example 2 | None | 20 μm | Δ | Δ |

The ink flow path members of Examples 1 to 4 and Comparative Examples 1 and 2 were each measured for its amine relative strength from the surface to a depth of 150 nm with Tof-SIMS. The results revealed that, in each of the ink flow path members of Examples 1 to 4, an amine compound having a perfluoroalkyl group was present with a concentration gradient in the thickness direction of the ink flow path member, and the concentration of the amine compound was highest in the outermost layer of the ink flow path member. On the other This application claims the benefit of Japanese Patent Application No. 2011-190624, filed Sep. 1, 2011, which is hereby incorporated by reference herein in its entirety.

What is claimed is:
1. A method of manufacturing a liquid ejection head, comprising:
   forming a covering resin layer comprising a photocationic polymerization initiator and a cationically polymerizable resin on a substrate having provided thereon an energy generating element for generating energy for ejecting liquid and a solid layer which is formed of a positive resist and serves as a pattern for a liquid flow path which communicates with a liquid ejection orifice for ejecting the liquid;

exposing the covering resin layer to development to form the liquid ejection orifice; and removing the solid layer to form the liquid flow path, wherein the covering resin layer comprises, as a cationic polymerization inhibitor, an amine compound having a perfluoroalkyl group.

2. The method of manufacturing a liquid ejection head according to claim 1, wherein the amine compound is an amine compound represented by the following formula 1:

$$CF_3(CF_2)_n\text{---}CH_2\text{---}NH_2 \qquad \text{Formula 1}$$

where n represents an integer of 3 or more.

3. The method of manufacturing a liquid ejection head according to claim 1, wherein the amine compound comprises an amine compound represented by the following formula 2

$$CF_3CF_2CF_2CF_2CF_2CF_2CF_2CF_2CH_2NH_2 \qquad \text{Formula 2}$$

4. The method of manufacturing a liquid ejection head according to claim 1, further comprising, between the formation of a covering resin layer and the formation of a liquid ejection orifice, heat-treating the covering resin layer in a state in which a surface of the covering resin layer on which the liquid ejection orifice is to be formed is exposed.

5. The method of manufacturing a liquid ejection head according to claim 1, wherein the formation of a covering resin layer comprises: applying on the substrate, a solution in which a material for forming the covering resin layer including the photocationic polymerization initiator, the cationically polymerizable resin, and the cationic polymerization inhibitor is dissolved in xylene; and evaporating the xylene to form the covering resin layer.

* * * * *